(12) United States Patent
Oepts et al.

(10) Patent No.: US 9,500,327 B2
(45) Date of Patent: Nov. 22, 2016

(54) LIGHT EMITTING ARRANGEMENT WITH ADAPTED OUTPUT SPECTRUM

(71) Applicant: KONINKLIJKE PHILIPS N.V., Eindhoven (NL)

(72) Inventors: Wouter Oepts, Shanghai (CN); Martinus Petrus Joseph Peeters, Weert (NL); Edwin Petronella Helena Van Lier, Neer (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/904,873

(22) PCT Filed: Jul. 18, 2014

(86) PCT No.: PCT/IB2014/063215
§ 371 (c)(1),
(2) Date: Jan. 13, 2016

(87) PCT Pub. No.: WO2015/015363
PCT Pub. Date: Feb. 5, 2015

(65) Prior Publication Data
US 2016/0161067 A1    Jun. 9, 2016

(30) Foreign Application Priority Data

Aug. 1, 2013 (EP) ...................................... 13178861

(51) Int. Cl.
*F21K 99/00* (2016.01)
*F21V 9/16* (2006.01)
(Continued)

(52) U.S. Cl.
CPC ............... *F21K 9/56* (2013.01); *C09K 11/663* (2013.01); *C09K 11/7734* (2013.01);
(Continued)

(58) Field of Classification Search
CPC ... F21K 9/56; C09K 11/663; C09K 11/7774; C09K 11/7734; H01L 25/0753; F21V 9/16
See application file for complete search history.

(56) References Cited

U.S. PATENT DOCUMENTS 6,234,648 B1    5/2001  Borner et al.
7,005,679 B2    2/2006  Tarsa et al.
(Continued)

FOREIGN PATENT DOCUMENTS

DE    102008015712 A1    10/2008
JP        2000275636 A    10/2000
(Continued)

*Primary Examiner* — Joseph L Williams

(57) ABSTRACT

A light-emitting arrangement (100) is disclosed, which is adapted to produce white output light enhancing the color perception of e.g. food in retail environments. The light-emitting arrangement comprises at least one blue light-emitting element (102) adapted to emit light having an emission peak in a first wavelength range of from 440 to 460 nm, and at least one deep blue light-emitting element (101) adapted to emit light having an emission peak in a second wavelength range of from 400 to 440 nm. Further, the light-emitting arrangement comprises at least one narrow band wavelength converting material (104) arranged to receive light emitted by said deep blue light-emitting element, and at least one broadband wavelength converting material (105) arranged to receive light emitted by at least one of said blue light-emitting element and said deep blue light-emitting element. A spotlight comprising such a light-emitting arrangement, and an illumination device comprising a plurality of the light-emitting arrangements, is also disclosed.

13 Claims, 3 Drawing Sheets

(51) Int. Cl.
*H01L 25/075* (2006.01)
*C09K 11/66* (2006.01)
*C09K 11/77* (2006.01)
*F21W 131/405* (2006.01)
*F21Y 101/02* (2006.01)
*F21Y 103/00* (2016.01)
*F21Y 113/00* (2016.01)
*H01L 33/50* (2010.01)

(52) U.S. Cl.
CPC ............ *C09K 11/7774* (2013.01); *F21V 9/16* (2013.01); *H01L 25/0753* (2013.01); *F21W 2131/405* (2013.01); *F21Y 2101/02* (2013.01); *F21Y 2103/003* (2013.01); *F21Y 2113/005* (2013.01); *H01L 33/504* (2013.01); *H01L 33/507* (2013.01); *H01L 2924/0002* (2013.01)

(56) References Cited

U.S. PATENT DOCUMENTS

| | | |
|---|---|---|
| 7,938,550 B2 | 5/2011 | Takenaka |
| 2004/0207313 A1 | 10/2004 | Omoto et al. |
| 2005/0211992 A1 | 9/2005 | Nomura et al. |
| 2006/0261742 A1 | 11/2006 | Ng et al. |
| 2007/0146639 A1 | 6/2007 | Conner |
| 2008/0238335 A1 | 10/2008 | Feldmeier et al. |
| 2008/0246419 A1 | 10/2008 | Deurenberg |
| 2010/0128461 A1 | 5/2010 | Kim et al. |
| 2010/0289044 A1 | 11/2010 | Krames et al. |
| 2012/0161170 A1 | 6/2012 | Dubuc et al. |

FOREIGN PATENT DOCUMENTS

| | | |
|---|---|---|
| WO | 2010052640 A1 | 5/2010 |
| WO | 2012091973 A1 | 7/2012 |

LIGHT EMITTING ARRANGEMENT WITH ADAPTED OUTPUT SPECTRUM

CROSS-REFERENCE TO PRIOR APPLICATIONS

This application is the U.S. National Phase application under 35 U.S.C. §371 of International Application No. PCT/IB2014/063215, filed on Jul. 18, 2014, which claims the benefit of European Patent Application No. 13178861.4, filed on Aug. 1, 2013. These applications are hereby incorporated by reference herein.

FIELD OF THE INVENTION

The present invention relates to light-emitting arrangements adapted to produce output spectra having desirable spectral composition, and an illumination device and a spotlight comprising such light-emitting arrangements.

BACKGROUND OF THE INVENTION

Light sources or illumination devices consisting of light-emitting diodes (LEDs) are increasingly used for replacing conventional light sources such as incandescent lamps and fluorescent light sources. LEDs offer many advantages compared to conventional light sources, especially when it comes to light conversion efficiency. However, one disadvantage is that LEDs generate light in a relatively narrow spectral band.

In WO 2010/052640, an illumination device is disclosed wherein a blue LED, a blue-to-green converting phosphor, and a red LED are combined to provide white light producing high red saturation. Such device may e.g. be used for enhancing the color perception of food in retail environments.

However, although the light is perceived as white light and has good color rendering, there is still a need for providing a smaller light-emitting arrangement capable of providing a desired saturation of red and/or green, and which is suitable for accent illumination applications and illumination devices that can be mounted in relatively narrow spaces.

SUMMARY OF THE INVENTION

It is an object of the present invention to provide a white light emitting arrangement having a good rendition of red and/or green and which is capable of providing an improved saturation of red and/or green.

It is also an object of the present invention to provide a light-emitting arrangement which is relatively small so as to enable a relatively small beam angle suitable for accent lighting e.g. in retail environments, and to enable an illumination device that can be arranged in relatively small or narrow spaces.

According to a first aspect of the invention, these and other objects are achieved by a light-emitting arrangement adapted to produce output light, comprising at least one blue light emitting element adapted to emit light having an emission peak in a first wavelength range of from 440 to 460 nm, and at least one deep blue light-emitting element adapted to emit light having an emission peak in a second wavelength range of from 400 to 440 nm. The light-emitting arrangement also comprises at least one narrow band wavelength converting material which is arranged to receive light emitted by the deep blue light-emitting element, and at least one broadband wavelength converting material which is arranged to receive light emitted by at least one of the blue light-emitting element and the at least one deep blue light-emitting element. The wavelength converting materials may also be referred to as "phosphors".

According to a second aspect, the above objects are achieved by an illumination device comprising a plurality of light-emitting arrangements according to the first aspect, wherein the plurality of light-emitting arrangements are consecutively arranged along a length direction of the illumination device. Each of the light-emitting arrangements comprises a deep blue light-emitting element, a blue light-emitting element, a narrow band wavelength converting material, and a broadband wavelength converting material according to the first aspect.

According to a third aspect, the above objects are achieved by a spotlight comprising at least one light-emitting arrangement according to the first aspect.

As used herein, the term "light-emitting element" is used to define any device or element that is capable of emitting radiation in for example the visible region, the infrared region, and/or the ultraviolet region when activated e.g. by applying a potential difference across it or passing a current through it. Each light-emitting element has at least one light source. Examples of light sources include semiconductor, organic, or polymer/polymeric light-emitting diodes (LEDs), laser diodes, or any other similar devices as would be readily understood by a person skilled in the art. Furthermore, the term light-emitting element can be used to define a combination of the specific light source that emits the radiation in combination with a housing or package within which the specific light source or light sources are placed. For example, the term light-emitting element may comprise a bare LED die arranged within a housing, or an array of LED elements, which also may be referred to as a LED package.

As used herein, "deep blue" or "short wavelength blue" denotes blue light having an emission peak in the wavelength range of from 400 to 440 nm. Furthermore, "blue", "regular blue", "normal blue" or "standard blue" generally refers to light having a peak wavelength in the range of from 440 to 460 nm.

The narrow band wavelength converting material used in the arrangement according to the invention may be any wavelength converting material known in the art having an absorption in the range of from 400 to 440 nm, preferably close to the emission maximum of the deep blue light-emitting element, and a narrow emission spectrum with a full width half maximum (FWHM) of less than 50 nm, such as less than 20 nm, and for example about 15 nm.

The broadband wavelength material used in the arrangement according to the invention may be any wavelength converting material known in the art having an emission spectrum with a FWHM of 50 nm or more, for example about 90 nm. Hence, the terms "narrow band" and "broadband" refers to the band width of the emission spectrum of the wavelength converting materials.

The deep blue light-emitting elements, the standard blue light-emitting elements, and the narrow band and broadband wavelength converting materials may be arranged on a substrate using e.g. a chip on board technology. This is advantageous in that the need for using a mixing chamber and/or remote phosphor may be eliminated, which allows for a relatively small light-emitting arrangement. Such light-emitting arrangement may e.g. be used for providing relatively small illumination devices and spotlights having a relatively small beam angle.

Further, the standard blue light-emitting element and the deep blue light-emitting element may both be electrically powered by a single, common channel driver. This is advantageous over light-emitting arrangements using e.g. direct red LEDs requiring a multichannel driver. Thereby the need for multichannel drivers may be eliminated, which allows for a reduction of the manufacturing cost.

The relatively small size of the light-emitting arrangement also allows for linear modules, i.e. illumination devices comprising a holder with a string of consecutively arranged light-emitting arrangements, which can be mounted in relatively narrow spaces, such as e.g. mullions, and freezers, coolers, and shelves e.g. in food retail environments where color perception is of great interest. The light-emitting arrangement may also be arranged relatively close to each other, which advantageously allows for a relatively homogeneous emission of light.

The relatively small size of the light-emitting arrangement further enables for a spotlight providing a relatively narrow beam spot lighting suitable for e.g. accent lighting.

By combining a broadband wavelength converting material with a narrow band wavelength converting material, the composition of the total output spectrum may be varied so as to achieve a desired color temperature and rendering of light emitted by the light-emitting arrangement. For example, the thickness of a layer of wavelength converting material and/or the amount or portion of the emitted light that is received by the broadband wavelength converting material and the narrow band wavelength converting material, respectively, may be varied so as to adjust the total output spectrum, thereby producing light having the desired color rendering and saturation.

In embodiments of the present invention, the at least one narrow band wavelength converting material is a narrow band red phosphor which is adapted to emit light having an emission peak in a red wavelength range.

In a study, the present inventors found that by combining blue light with a certain amount of deep blue light partially converted by the narrow band red phosphor, an excellent red rendition can be achieved. Thus, the present invention is based on a realization that by adding a certain amount of short wavelength blue, which advantageously allows for an efficient excitation of the narrow band red phosphor converting at least some of the short wavelength blue into red, a white light output having an excellent red rendition can be achieved. Thereby the present invention provides for a light-emitting arrangement which can be used for displaying e.g. meat in a supermarket with a highly saturated red rendering.

Further, it has been established that an object appears whiter if it appears slightly chromatic with a blue tint. Hence, a bluish color is perceived as whiter than a color point that lies on the black body line (BBL). It is therefore possible to obtain "crisp" white light by tuning the color point of a light source below the BBL by addition of deep blue. The deep blue may be provided by letting a portion of the light emitted by the deep blue light-emitting element pass by, or leak through, the narrow band red phosphor to form part of the total output spectrum. Thereby an excellent white rendering, or "crisp" white, having a high red saturation, is provided.

In embodiments of the present invention, the at least one narrow band wavelength converting material is a narrow band green phosphor which is adapted to emit light having an emission peak in a green wavelength range. The narrow band green phosphor may provide a relatively low emission in the yellow wavelength range, which has shown to improve the perception of highly saturated green. By adding a portion of deep blue to the total output spectrum as described above, a "crisp" white having high green saturation is provided.

In embodiments of the present invention, the at least one broadband wavelength converting material is a broadband green phosphor adapted to emit light having an emission peak in a green wavelength range, a broadband green-yellow or yellow phosphor adapted to emit light having an emission peak in a green-yellow or yellow wavelength range, or a broadband red phosphor adapted to emit light having an emission peak in a red wavelength range.

The broadband green or yellow phosphor may e.g. be combined with the narrow band red phosphor so as to provide white output light having good rendition of saturated red and/or green. Alternatively, the broadband red phosphor may be combined with the narrow band green phosphor in order to achieve white light having good red and/or green rendition. The portion of blue light and deep blue light converted by the phosphors may be varied to as to adjust the total output spectrum, and thereby produce light having the desired color rendering and saturation.

According to an embodiment of the present invention, at least a portion of the light emitted by at least one of the at least one deep blue light-emitting element and the at least one blue light-emitting element is not converted by the narrow band wavelength converting material and/or the broadband wavelength converting material. Instead, this light may form part of the total output spectrum, whose composition advantageously may be varied and tuned so as to achieve the desired output light. The total output spectrum may be tuned by e.g. varying the ratio of the amount of deep blue light that is converted by the narrow band wavelength converting material and the amount of deep blue light not being converted. Similarly, the ratio between the amount of standard blue light being converted by the broadband wavelength converting material and the amount of standard blue light not being converted may be varied so as to adjust the composition of the total output spectrum.

In embodiments of the present invention, at least a portion of the at least one narrow band wavelength converting material is provided on the at least one deep blue light-emitting element. Additionally, or alternatively, at least a portion of the broadband wavelength converting material is provided on the at least one blue and/or the at least one deep blue light-emitting element. The narrow band and/or the broadband wavelength converting material may typically be provided as a layer covering at least a portion of a light-emitting element. Alternatively, the narrow band and/or the broadband wavelength converting material may be contained in an encapsulant surrounding the light-emitting element.

According to an embodiment, at least one of the at least one narrow band and the at least one broadband wavelength converting materials is arranged remotely from the at least one deep blue light-emitting element.

In embodiments of the present invention, the narrow band red phosphor comprises the elements Mg, O, Ge, and optionally Mn as a dopant. For example, the narrow band red phosphor may be an MGM phosphor. In other embodiments, the narrow band green phosphor may comprise the elements Si, Al, O, and N.

A broad band green or yellow phosphor may comprise at least some of the elements Lu, Y, Al and O, and typically also Ce as a dopant. For example, the broadband green or yellow phosphor may be LuAG:Ce or YAG:Ce.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
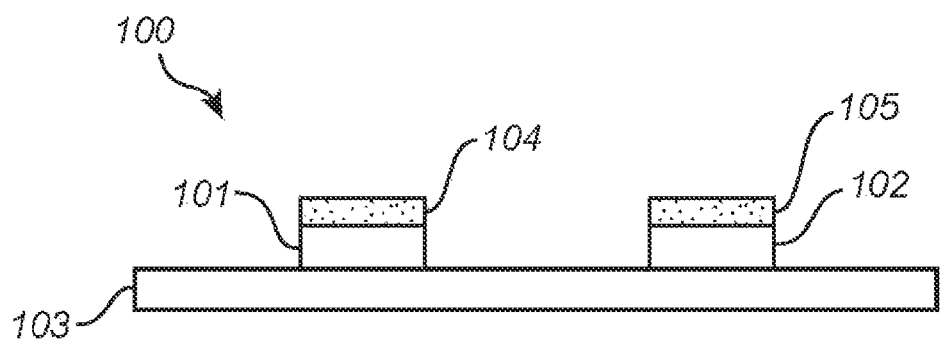
FIG. 1 is a schematic side view of a light-emitting arrangement according to embodiments of the invention.

FIG. 1 illustrates an embodiment of the present invention in the form of a light-emitting arrangement 100 which may form part of e.g. an illumination device or a spotlight. The illumination device and the spotlight may also be equipped with driving electronics etc, as appreciated by a skilled person. The light-emitting arrangement 100 comprises a blue light-emitting element 102 and a deep blue light-emitting element 101 arranged on a substrate 103. The blue light-emitting element 102, here a first light-emitting diode (LED), is adapted to emit light in the standard blue wavelength range, in particular from 440 to 460 nm, whereas the deep blue light-emitting element 101, here a second LED, is adapted to emit light in the deep blue wavelength range, i.e. from 400 to 440 nm. A narrow band wavelength converting material 104, such as a narrow band red phosphor, is arranged on the second, deep blue LED 101, and a broadband wavelength converting material 105, such as e.g. a broadband green phosphor, is arranged on the blue light-emitting element 102. It will however be appreciated that the narrow band wavelength converting material 104 may be a narrow band green phosphor, and that the broadband wavelength converting material 105 may be a broadband red phosphor.

The narrow band red phosphor 104 is adapted to convert at least part of the light emitted by the deep blue LED 101 into light of longer wavelengths, typically of the red spectral range within the range of from e.g. 600 to 700 nm, and with a maximum of e.g. 660 nm. Furthermore, the broadband green phosphor 105 converts at least part of the light emitted by the standard blue LED 102 into light of e.g. the green spectral range. During operation, light emitted from the deep blue and/or blue LEDs 101, 102 will be at least partially converted by the narrow band red and/or broadband green phosphor 104, 105 to yield a resulting combination that is perceived as white. Light emitted by the deep blue LED 101 will be at least partially converted by the narrow band red phosphor 104 and thus provide a spectral contribution to the total light output from the light-emitting arrangement in the form of an emission peak in the wavelength range of from 600 nm to 700 nm, such as about 660 nm. Hence, the light-emitting arrangement 100 may yield white output light having an additional emission peak about e.g. 660 nm. Further, at least some of the deep blue light emitted by the deep blue LED 101 may pass the narrow band red phosphor 104, or leak, such that a portion of the deep blue light, which is not converted by the narrow band red phosphor 104, forms part of the total output spectrum.

The substrate 103 may be or form part of any suitable physical and/or functional support structure, including a printed circuit board (PCB). The substrate 103 may carry means for electrical connection required for the light-emitting elements 101, 102, such as a channel driver. Optionally, parts of the substrate 103 may be reflective.

The narrow band red phosphor 104 may comprise the elements Mg, O, and Mn, also referred to as MGM. Typically, an MGM material comprises the compounds MgO, $GeO_2$, and MnO. Additionally, the MGM material may comprise additional elements, such as Ge, F and/or Sn. One example of a narrow band red phosphor material is $Mg_4GeO_{5.5}F:Mn$. Another example, in which the fluorine is not present, is $Mg_4GeO_6:Mn$. However, the stoichiometric ratios between the elements differ between MGM materials provided by different manufacturers.

In case of the narrow band wavelength converting material 104 being a narrow band green phosphor, it may comprise the elements Si, Al, O, and N, forming e.g. beta-sialon.

The broadband wavelength converting material 105 may e.g. be a green phosphor comprising the elements Lu, Al, and O, and optionally Ce and/or Y as a dopant. For example, the broadband green phosphor may be LuAG:Ce or LuYAG:Ce, wherein part of the Lu ions is replaced by Ce and/or Y, respectively.

Examples phosphors materials which emit red light may include, but are not limited to, ECAS ($Ca_{1-x}AlSiN_3:Eu_x$, wherein $0<x\leq1$; preferably $0<x\leq0.2$, and wherein the dopant additionally may comprise Sr) and BSSN ($Ba_{2-x-z}M_x Si_{5-y}Al_yN_{8-y}O_y:Eu_z$ wherein M represents Sr or Ca, $0\leq x\leq 1$, $0\leq y\leq 4$, and $0.0005\leq z\leq 0.05$ and preferably $0\leq x\leq 0.2$).

Figure 2:
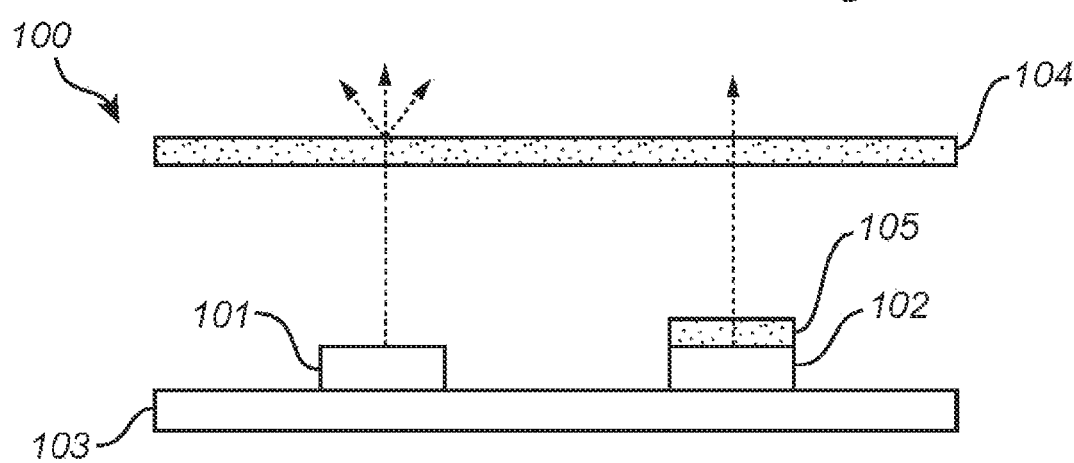
FIG. 2 is a schematic side view of a light-emitting arrangement according to another embodiment of the invention.

FIG. 2 shows an embodiment of the invention, wherein a light-emitting arrangement 100 comprises a deep blue light-emitting element, here a deep blue LED 101, and a standard blue light-emitting element, here a standard blue LED 102. The deep blue LED 101 is adapted to emit deep blue light of the wavelength range of from 400 to 440 nm. The standard blue LED 102 is adapted to emit light of the wavelength range of from 440 to 460 nm. According to this embodiment, the broadband wavelength converting material 105, e.g. a green phosphor, is arranged on the blue light-emitting element 102 so as to receive and convert at least part of the light emitted be the standard blue LED. In contrast to the embodiment described above with reference to FIG. 1, the narrow band wavelength converting material 104 is arranged remotely from both LEDs 101, 102. The wavelength converting material 104 may be referred to as a "remote phosphor" or as being in "remote configuration". The narrow band wavelength converting material 104 may be self-supporting and may be provided on the form of a film, a sheet, a plate, o disc, or the like. Although not shown in FIG. 2, the narrow band wavelength converting material 104 may be supported by one or more side walls surrounding the light-emitting elements 101, 102 such that the narrow band wavelength converting material 104 may form a lid or a window. It will be appreciated that other configurations also are possible, wherein e.g. the broadband wavelength converting material 105 is a remote phosphor, whereas the narrow band wavelength converting material 104 is arranged on the deep blue LED 101. Additionally, or alternatively, the narrow band wavelength converting material and the broadband wavelength converting material 104, 105 may both be in remote configuration, optionally mixed or contained in a single layer of wavelength converting element so as to form a common remote phosphor element 104. A wavelength converting material 104, 105 being arranged in a remote configuration does not necessarily exclude the same phosphor from at the same time also being arranged on e.g. on the blue light-emitting element 102 and/or the deep blue light-emitting element 101.

Typically, the narrow band red phosphor 104 is adapted to convert at least a part of the deep blue light into light of longer wavelengths, such as light having an emission peak within the range of from 600 to 700 nm, for example about 660 nm. Accordingly, the broadband green phosphor 105 is adapted to convert at least a part of the standard blue light into light of a green spectral range so that the resulting combination of blue light, green light and red light is perceived as white. Thus, light emitted by the deep blue LED 101 is received by the narrow band red phosphor 104 and is partially converted, whereas light emitted by the standard blue LED 102 is at least partially converted by the green phosphor 105 and then substantially transmitted by the narrow band red phosphor 104. At least some of the deep blue light and/or standard blue light emitted by the light-emitting element(s) 101, 102 may form part of the resulting output light without being converted by the narrow band and/or broadband wavelength converting material(s) 104, 105.

Figure 3:
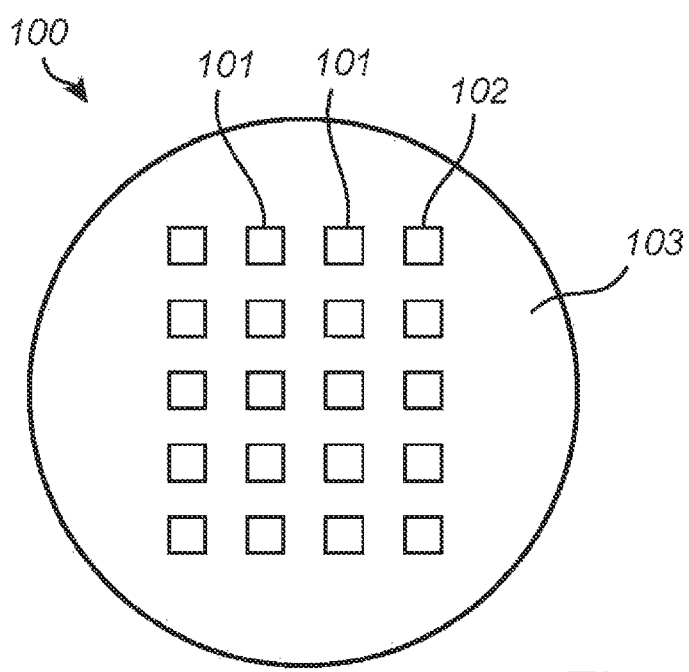
FIG. 3 is a schematic top view of a light-emitting arrangement according to another embodiment of the invention.

With reference to FIG. 3, there is shown a top view of a light-emitting arrangement 100 comprising a plurality of light-emitting diodes 101, 102, here 20 individual LEDs, arranged on a substrate or support 103. The arrangement comprises a plurality of standard blue LEDs 102 adapted to emit light having an emission peak in a first wavelength range of from 440 to 460 nm, and a plurality of deep blue LEDs 101 adapted to emit light having an emission peak in a second wavelength range of from 400 to 440 nm. A narrow band wavelength converting material, such as a narrow band red phosphor (not shown) may be arranged so as to at least partly cover one or several of the deep blue LEDs 101, whereas a broadband wavelength converting material, such as a broadband green phosphor (not shown), may be covering at least a part of at least one of the standard blue LEDs 102. Alternatively, or additionally, a layer comprising the broadband green phosphor and/or the narrow band red phosphor may be arranged so as to cover the arrangement 100, i.e. covering both the LEDs 101, 102 and the substrate 103. The broadband green phosphor and/or the narrow band red phosphor may be arranged directly on the LEDs 101, 102, i.e. applied in direct contact with the LEDs 101, 102, or in remote configuration.

It will be appreciated that the narrow band wavelength converting material may be a narrow band green or yellow phosphor, and the broadband wavelength converting material a broadband red phosphor.

Figure 4:
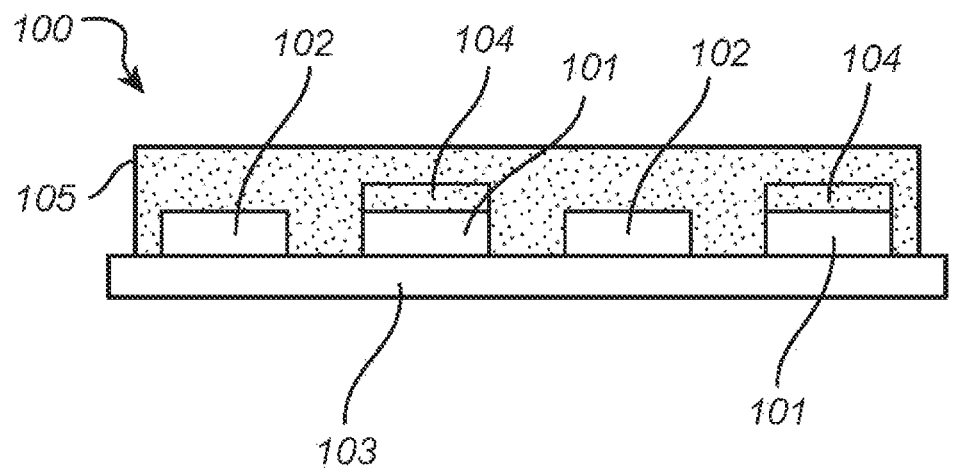
FIG. 4 is a schematic side view of a light-emitting arrangement according to another embodiment of the invention.

FIG. 4 illustrates another embodiment of a light-emitting arrangement 100 comprising a printed circuit board (PCB) 103 onto which a plurality of deep blue light-emitting elements 101 are arranged closely together with a number of standard blue light-emitting elements 102. A narrow band phosphor 104, e.g. a narrow band green phosphor, is arranged on the deep blue light-emitting elements 101 so as to convert at least part of the light emitted by the deep blue light-emitting elements 101 into light having a peak wavelength e.g. in the green range. Further, a composition comprising a broadband phosphor 105, e.g. a broadband red phosphor, is arranged such that it at least partly covers the PCB 103 of the light-emitting arrangement 100, and at least partly encloses the deep blue light-emitting elements 101 and the standard blue light-emitting elements 102 so as to a convert at least a portion of the emitted standard blue light into light having a peak wavelength e.g. in the red range. The composition comprising the broadband phosphor 105 may e.g. be applied by molding. At least some of the standard blue light and/or the deep blue light emitted by light-emitting elements 101, 102 may be output, or leaked, from the light-emitting arrangement 100 without being converted, and may thereby form part of the output light which e.g. may be used for illumination of e.g. food. In embodiments of the invention, the composition comprising the broadband phosphor 105 may optionally also comprise the narrow band phosphor 104, in which case it is not necessary to arrange a separate layer of narrow band phosphor directly on the deep blue light-emitting elements 101, as long as light emitted by the deep blue light-emitting elements 101 can be received by the narrow band phosphor 104.

Figure 5:
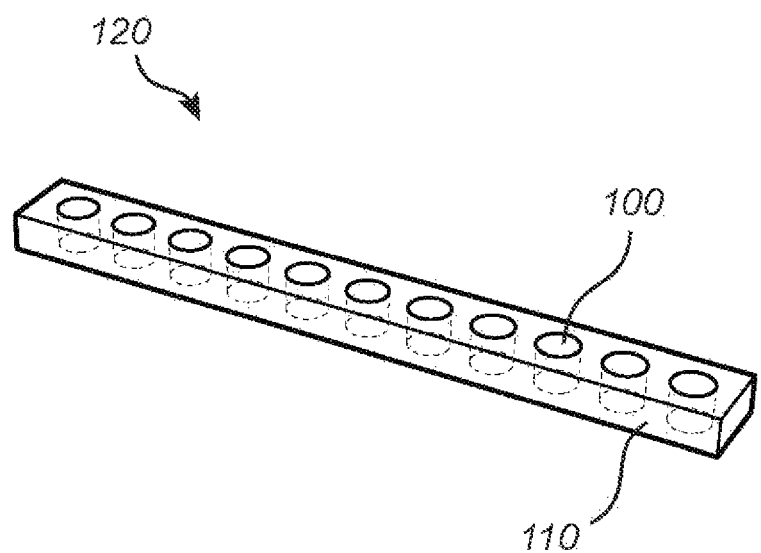
FIG. 5 is a schematic perspective view of an illumination device according to embodiments of the present invention.

FIG. 5 illustrates an illumination device 120 comprising a plurality of light-emitting arrangements 100 according to any one of the embodiments described with reference to FIGS. 1 to 4. The light-emitting arrangements 100 are consecutively arranged along a length direction of a holder 110 of the illumination device, and wherein each of the light-emitting arrangements 100 comprises the deep blue light-emitting element 101, the blue light-emitting element 102, the narrow band wavelength converting material 104, and the broadband wavelength converting material 105.

The inventors have found that the spectral composition of the output spectra, which e.g. may be determined by the ratio of light emitted by the standard blue light-emitting element(s) and light emitted by the deep blue light-emitting element(s), the ratio of the area covered by the broadband green and/or red phosphor and the area covered by the narrow band red and/or green phosphor 104, 105, and the thickness of the respective phosphors, may be adjusted so as to achieve a desired illumination of e.g. food. According to an example, the output light produced by the light-emitting arrangement may be tuned to a correlated color temperature (CCT) within the range of from 6500 to 8000 K, which has shown to enhance the perception of illuminated meat. In another example, the output light may be provided with a (CCT) within the range of from 2500 to 4500 K, which may enhance the perception fresh fruit being illuminated with the light-emitting arrangement.

Figure 6:
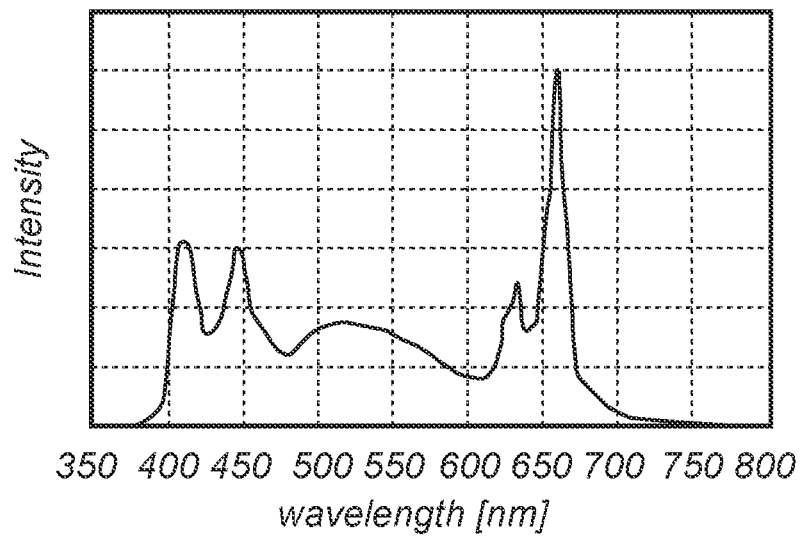
FIGS. 6 and 7 are graphs illustrating the emission spectrum recorded for a light-emitting arrangement according to embodiments of the invention.

FIG. 6 illustrates an example of a white spectrum from a study wherein the visual appearance of displayed meat, illuminated with a light-emitting arrangement according to an embodiment of the invention, was evaluated. In this example, the overall correlated color temperature (CCT) was tuned to 7500 K. During the test, it was found that the best visual result was achieved by a high red saturation, represented by a peak at about 660 nm in the spectrum of FIG. 6, with an excellent white rendition. The color point was tuned below the black body line (BBL).

Figure 7:
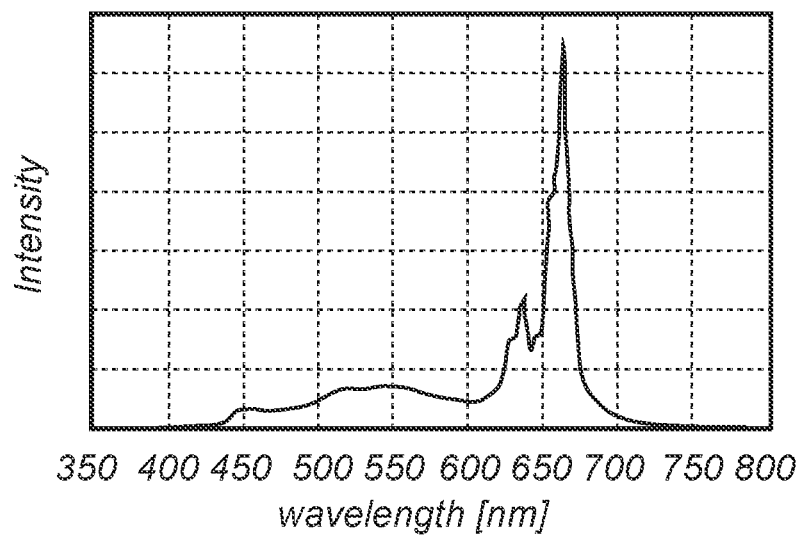

FIG. 7 illustrates an example of a white spectrum from a study similar to the study described with reference to FIG. 6; however, the visual appearance of fresh fruit being illuminated by the test arrangement was evaluated. In this example, the CCT of the light output by the test arrangement was tuned to 3000 K. The intensity of the red and green light output by the respective narrow band red phosphor 104 and the broadband green phosphor 105 was combined with blue light into the spectrum of FIG. 7, which was found to represent the visually most attractive result. The peak at 660 nm of the graph represents the contribution by the light converted by the narrow band red phosphor 104.

Hence, the white light-emitting arrangement according to the present invention provides excellent rendition of red and/or green, with improved saturation of red and/or green. Furthermore, the light-emitting arrangement is relatively small and hence suitable for accent lighting of e.g. food, and for illumination devices that can be arranged in relatively small or narrow spaces.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light-emitting arrangement adapted to produce output light, comprising:
   at least one blue light-emitting element adapted to emit light having an emission peak in a first wavelength range of from 440 to 460 nm;
   at least one deep blue light-emitting element adapted to emit light having an emission peak in a second wavelength range of from 400 to 440 nm;
   at least one narrow band wavelength converting material arranged to receive light emitted by said deep blue light-emitting element, wherein the narrow band wavelength converting material is adapted to emit light with a full width half maximum (FWHM) of less than 50 nm; and
   at least one broadband wavelength converting material arranged to receive light emitted by at least one of said blue light-emitting element and said deep blue light-emitting element, wherein the broadband wavelength converting material is adapted to emit light with a full width half maximum (FWHM) of 50 nm or more.

2. A light-emitting arrangement according to claim 1, wherein said at least one narrow band wavelength converting material is a narrow band red phosphor adapted to emit light having an emission peak in a red wavelength range.

3. A light-emitting arrangement according to claim 1, wherein said at least one narrow band wavelength converting material is a narrow band green phosphor adapted to emit light having an emission peak in a green wavelength range.

4. A light-emitting arrangement according to claim 2, wherein the at least one broadband wavelength converting material is a broadband green or yellow phosphor adapted to emit light having an emission peak in a green or yellow wavelength range.

5. A light-emitting arrangement according to claim 3, wherein the at least one broadband wavelength converting material is a broadband red phosphor adapted to emit light having an emission peak in a red wavelength range.

6. A light-emitting arrangement according to claim 2, wherein the narrow band red phosphor comprises the elements Mg, O, Ge and optionally Mn as a dopant.

7. A light-emitting arrangement according to claim 3, wherein the narrow band green phosphor comprises the elements Si, Al, O, and N.

8. A light-emitting arrangement according to claim 1, wherein at least a portion of the light emitted by the at least one deep blue light-emitting element forms part of the total output light.

9. A light-emitting arrangement according to claim 1, wherein at least a portion of the at least one narrow band wavelength converting material is provided on said at least one deep blue light-emitting element.

10. A light-emitting arrangement according to claim 1, wherein at least a portion of the broadband wavelength converting material is provided on said at least one blue and/or said at least one deep blue light-emitting element.

11. A light-emitting arrangement according to claim 1, wherein at least one of the narrow band wavelength converting material and the broadband wavelength converting material is arranged remotely from said at least one deep blue light-emitting element.

12. An illumination device, comprising a plurality of light-emitting arrangements according to claim 1, wherein the plurality of light-emitting arrangements are consecutively arranged along a length direction of the illumination device and wherein each comprises the deep blue light-emitting element, the blue light-emitting element, the narrow band wavelength converting material, and the broadband wavelength converting material.

13. A spotlight comprising at least one light-emitting arrangement according to claim 1.

* * * * *